(12) United States Patent
Happ et al.

(10) Patent No.: US 7,515,461 B2
(45) Date of Patent: Apr. 7, 2009

(54) CURRENT COMPLIANT SENSING ARCHITECTURE FOR MULTILEVEL PHASE CHANGE MEMORY

(75) Inventors: Thomas D. Happ, Tarrytown, NY (US); Hsiang-Lan Lung, Elmsford, NY (US); Thomas Nirschl, Essex Junction, VT (US)

(73) Assignees: Macronix International Co., Ltd., Hsinchu (TW); Qimonda North America Corporation, Cary, NC (US)

( * ) Notice: Subject to any disclaimer, the term of this patent is extended or adjusted under 35 U.S.C. 154(b) by 169 days.

(21) Appl. No.: 11/620,432

(22) Filed: Jan. 5, 2007

(65) Prior Publication Data

US 2008/0165570 A1 Jul. 10, 2008

(51) Int. Cl.
G11C 11/00 (2006.01)
G11C 7/10 (2006.01)
G11C 7/02 (2006.01)

(52) U.S. Cl. .................. 365/163; 365/148; 365/189.06; 365/189.15; 365/206

(58) Field of Classification Search ................ 365/163, 365/189.15, 189.06, 203, 148
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |

(Continued)

FOREIGN PATENT DOCUMENTS

WO WO 00/45108 A1 8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Ly D Pham
(74) *Attorney, Agent, or Firm*—Haynes Beffel & Wolfeld LLP

(57) ABSTRACT

A memory device and a method of reading the same includes a phase change element having a data state associated therewith that features maintaining the consistency of the data state of the phase change element in the presence of a read current. The memory circuit includes a sense amplifier that defines a sensing node. Circuitry selectively places the bit line in data communication with the sensing node, defining a selected bit line. A current source produces a read current, and a switch selectively applies the read current to the sensing node. Logic is in electrical communication with the sensing node to control the total energy to which the phase change material is subjected in the presence of the read current so that the data state remains consistent.

20 Claims, 10 Drawing Sheets

U.S. PATENT DOCUMENTS

| | | |
|---|---|---|
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A * | 4/2000 | El Hajji ............. 365/189.15 |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 * | 4/2003 | Wu ....................... 365/148 |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,563 B2 | 10/2004 | Xu |
| 6,815,704 B1 | 11/2004 | Chen |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 2004/0248339 A1 | 12/2004 | Lung |
| 2005/0093022 A1 | 5/2005 | Lung |
| 2005/0215009 A1 | 9/2005 | Cho |
| 2006/0198183 A1* | 9/2006 | Kawahara et al. ............ 365/163 |
| 2007/0008786 A1* | 1/2007 | Scheuerlein ............ 365/189.01 |
| 2007/0153563 A1* | 7/2007 | Nirschl ........................ 365/148 |
| 2007/0201267 A1* | 8/2007 | Happ et al. .................. 365/163 |
| 2008/0025089 A1* | 1/2008 | Scheuerlein et al. ..... 365/185.03 |
| 2008/0094871 A1* | 4/2008 | Parkinson .................... 365/100 |
| 2008/0101110 A1* | 5/2008 | Happ et al. .................. 365/163 |
| 2008/0137400 A1* | 6/2008 | Chen et al. .................. 365/163 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Non-volatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Straiss. Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing the the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

CURRENT COMPLIANT SENSING ARCHITECTURE FOR MULTILEVEL PHASE CHANGE MEMORY

BACKGROUND OF THE INVENTION

1. Field of the Invention

The present invention relates to high density memory devices based on phase change memory materials and particularly sensing circuitry for such devices.

2. Description of Related Art

Phase change memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change memory materials, like chalcogenide based materials and similar materials, also can be caused to change phase by application of electrical current at levels suitable for implementation in integrated circuits. The generally amorphous phase is characterized by higher resistivity than the generally crystalline phase, which can be readily sensed to indicate data. These properties have generated interest in using programmable resistive material to form nonvolatile memory circuits, which can be read and written with random access.

Modulating between amorphous and crystalline phases is achieved by controlling the thermal energy to which the phase change material is subjected. For example, modulating the phase change material from the amorphous phase to the crystalline phase is achieved by heating the same to a temperature between the glass transition temperature of the phase change material and the melting temperature. This is referred to as "set" and occurs during a relatively low current operation. Modulating from the crystalline phase to the amorphous phase, referred to as "reset," occurs during a relatively high current operation during which melting of the phase change material occurs followed by rapidly cooling the same below its glass transition temperature at a rate to reduce, if not prevent, nucleation and growth of crystallites. To that end, the phase change material may be subjected to a short high current density pulse to melt or break down the crystalline structure so that at least a portion of the phase change structure stabilizes in the amorphous phase at ambient temperatures. By controlling the amount of crystalline and amorphous phases of the material in a phase change element, it is possible to establish multiple memory states in the element, including a reset state comprising a substantially all-amorphous phase in an active region of the material, one or more intermediate states in which mixtures of amorphous phase and crystalline phase in the active region of the material are formed, and a set state comprising a substantially all-crystalline phase in the active region of the material.

During a read operation the phase change material is subjected to a read pulse in order to determine the resistance of the memory element indicating whether the phase change material is in a set state, a reset state or in an intermediate state. It is desirable, however, to select a suitable read pulse so that the relative amounts of amorphous and crystalline phases of the phase change material are not disturbed during the read operation.

SUMMARY OF THE INVENTION

A memory device and a method of reading the same includes a phase change element having a data state associated therewith that features maintaining the consistency of the data state of the phase change element in the presence of a read current. Specifically, it was determined that the read current may produce sufficient thermal energy in the phase change element to alter the physical characteristics of the same. This may present as a data state change, or require establishment of large margins for sensing the data states of the device. A memory device in accordance with one embodiment of the present invention includes a memory cell having a phase change element with a data state associated therewith coupled to a bit line and a word line. A sense amplifier defines a sensing node. Circuitry selectively places the bit line in data communication with the sensing node, defining a selected bit line. A current source produces a read current, and a switch selectively applies the read current to the sensing node. Logic is in electrical communication with the sensing node to control total energy to which the phase change material is subjected, in the presence of the read current, so that the data state remains consistent. The total energy applied during a read cycle is controlled by applying a pulse of read current from a constant current source so that the read current pulse has a substantially constant magnitude, having a pulse width that is controlled in response to the resistance of the phase change element.

DETAILED DESCRIPTION

Figure 1:
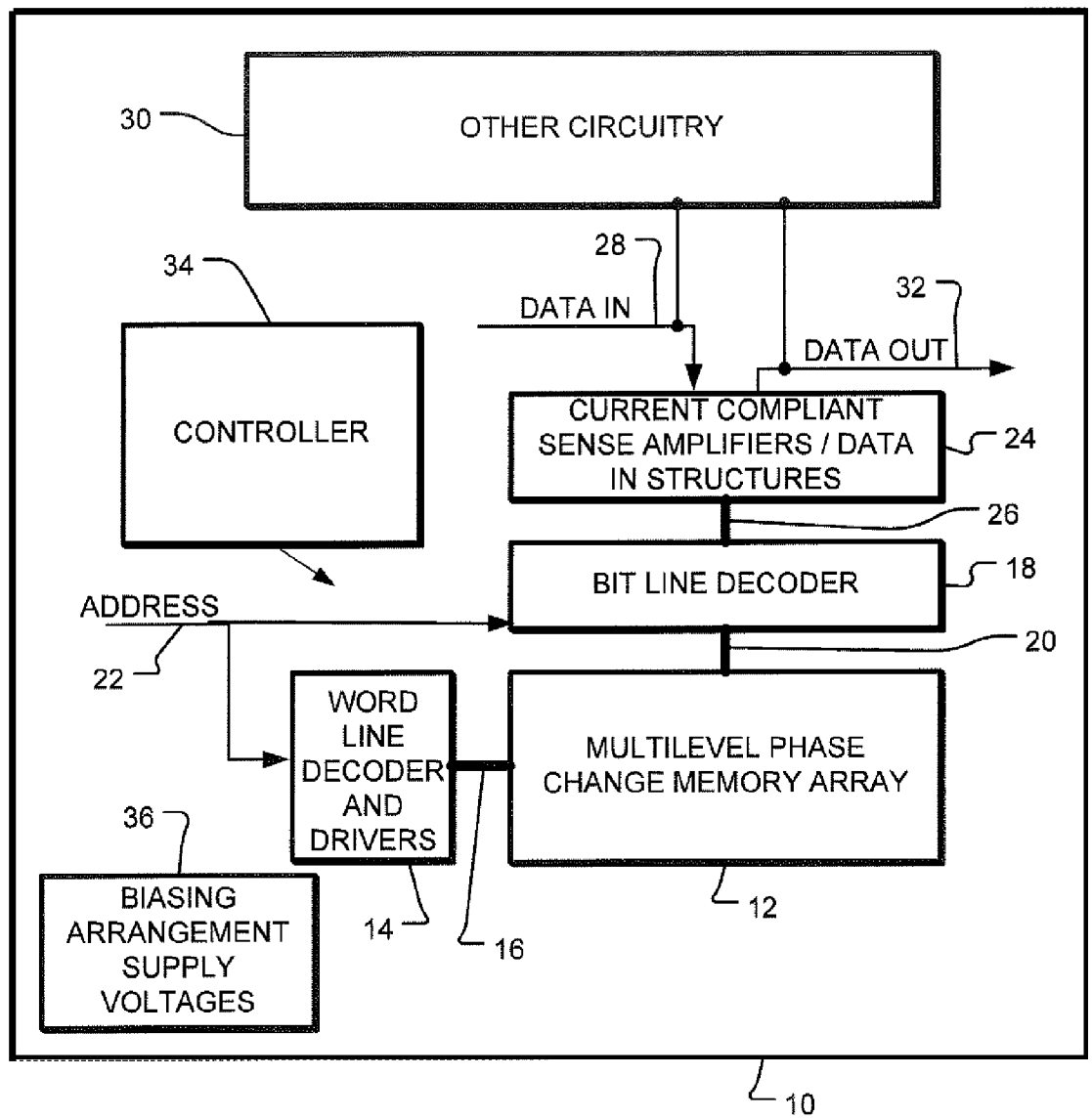
FIG. 1 is a block diagram of an integrated circuit device in accordance with the present invention.

Referring to FIG. 1, shown is a simplified block diagram of an integrated circuit 10 in which the present invention may be implemented. Circuit 10 includes a memory array 12 implemented using phase change memory cells (not shown) on a semiconductor substrate, discussed more fully below. A word line decoder 14 is in electrical communication with a plurality of word lines 16. A bit line decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
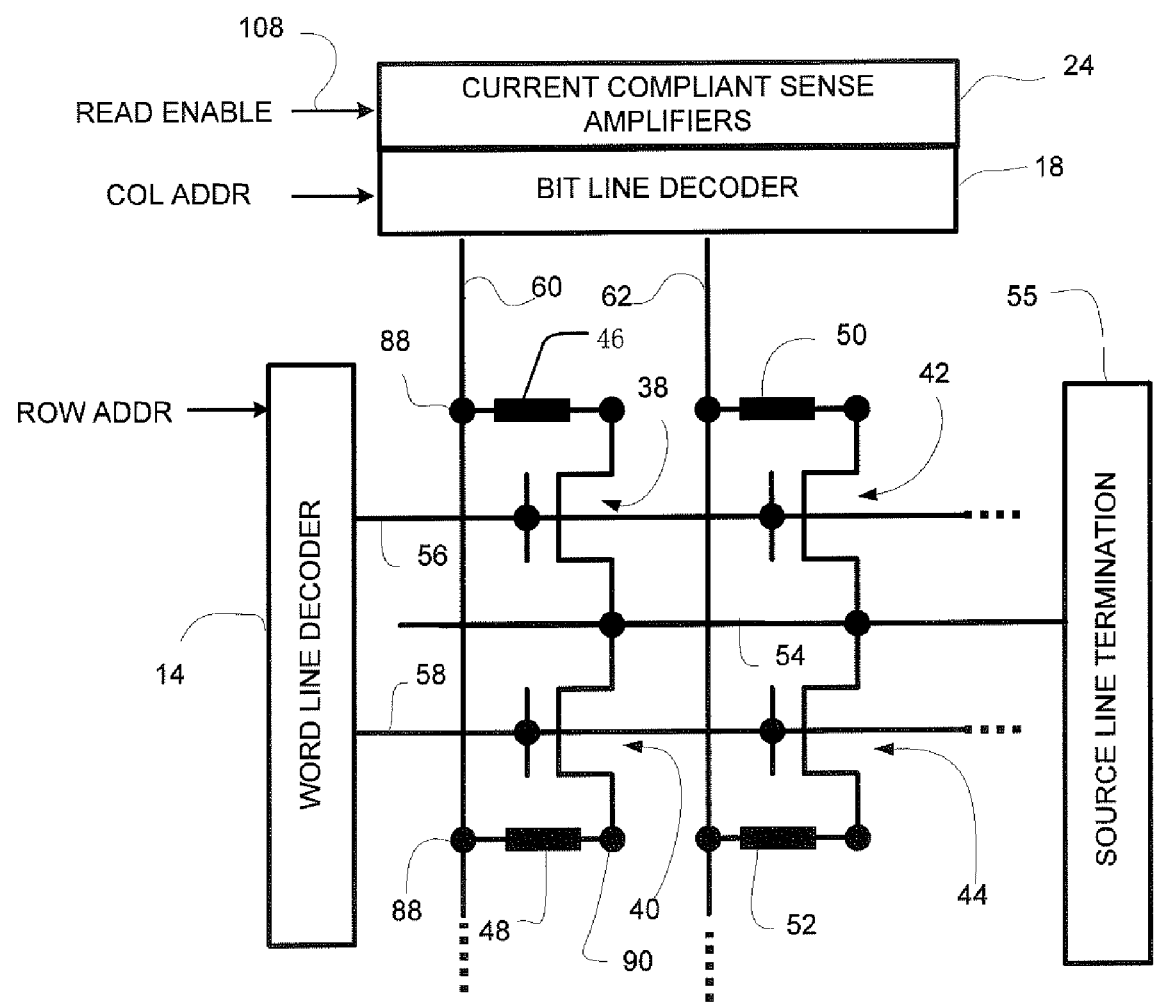
FIG. 2 is a partial schematic diagram of a representative memory array as shown in FIG. 1.

As shown in FIG. 2 each of the memory cells of array 12 includes an access transistor (or other access device such as a diode), four of which are shown as 38, 40, 42 and 44, and a phase change element, shown as 46, 48, 50 and 52. Sources of each of access transistors 38, 40, 42 and 44 are connected in common to a source line 54 that terminates in a source line termination 55. In another embodiment the source lines of the select devices are not electrically connected, but independently controllable. A plurality 16 of word lines including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality 20 of bit lines including bit lines 60 and 62 have one end of phase change elements 46 and 48 connected to bit line 60. Specifically, phase change element 46 is connected between the drain of access transistor 38 and bit line 60, and phase change element 48 is connected between the drain of access transistor 48 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to source.

Figure 3:
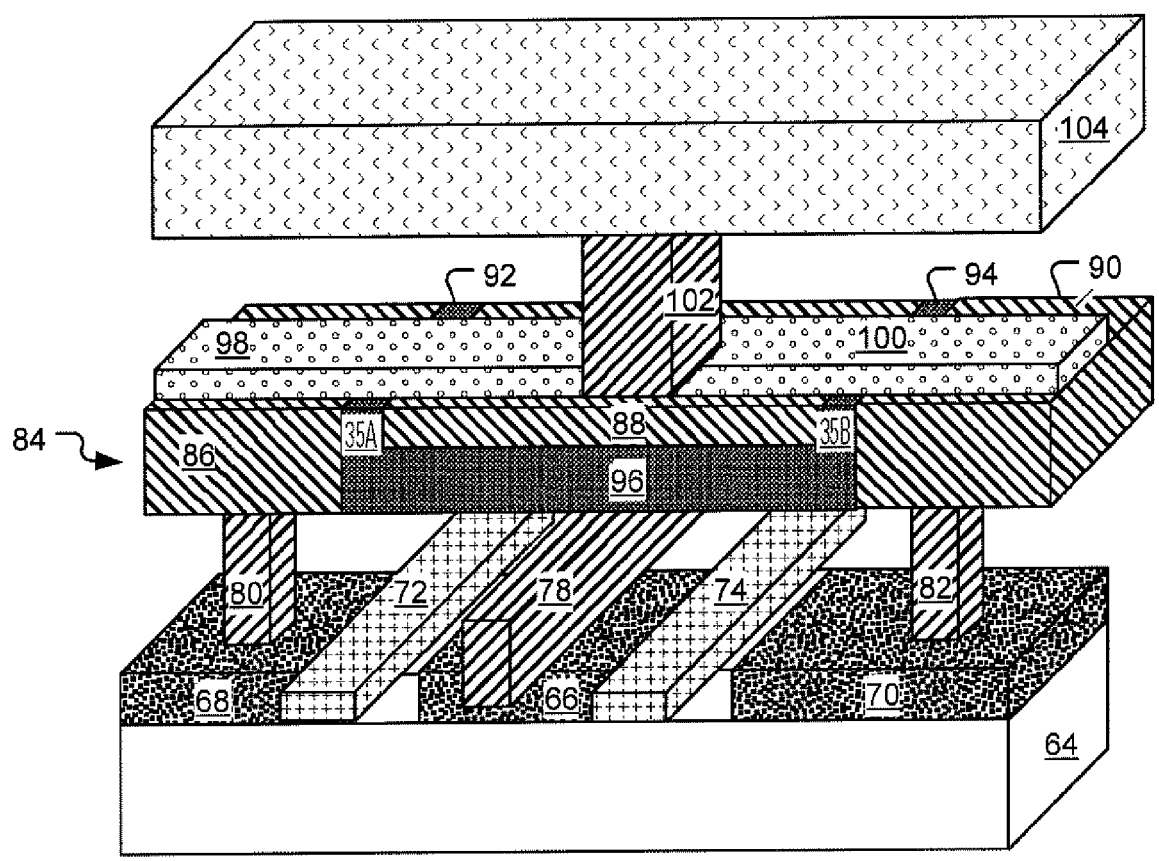
FIG. 3 is a perspective view showing the structure of a pair of memory cells, suitable for use in the array of FIG. 2.

Referring to FIG. 3, a basic structure of an example implementation of access transistors 38, 40, 42 and 44 and phase change elements 46, 48, 50 and 52 in memory cells of array 12 is discussed with respect to access transistors 38 and 40,and phase change elements 46 and 48. In this example, access transistors 38 and 40 are formed employing standard semiconductor processes used for fabricating circuits on a p-type semiconductor substrate 64. To that end, an n-type terminal 66 defines a common source region, and n-type terminals 68 and 70 define the drain regions of access transistors 38 and 40, respectively. Polysilicon layers 72 and 74 form word lines 56 and 58 and define the gates of access transistors 38 and 40, respectively. A dielectric fill layer (not shown) is formed over polysilicon layers 72 and 74. The fill layer (not shown) is patterned and conductive structures, including a common source line 78 and plug structures 80 and 82 are formed. The conductive material may be tungsten or other materials and combinations suitable for the plug and line structures. In other embodiments, the common source line may comprise buried diffusion with a silicide layer, or other conductive line structures. Common source line 78 is in electrical communication with terminal 66 acting as source region and corresponds with source line 54 of array 12. Each of plug structures 80 and 82 are in electrical communication with terminals 68 and 70, respectively. The fill layer (not shown), common line 78 and plug structures 80 and 82, have a generally planar top surface in the illustrated example, suitable for formation of an electrode layer 84.

Electrode layer 84 includes electrode members 86, 88 and 90 that are separated from one another by electrically insulative walls 92 and 94 extending from an electrically insulating base member 96. Base member 96 may be thicker than walls 92 and 94 in embodiments of the structure, and separates electrode member 88 from common line 78.

A thin film bridge 98 of memory material, such as $Ge_2Sb_2Te_5$ (GST), overlies electrode layer 84 extending from electrode ember 88, away from electrode member 90 across wall 92 (including element 35A), terminating in superimposition with electrode member 86. In this manner, thin film bridge 98 defines phase change element 46. A thin film bridge 100 of memory material, such as GST, overlies electrode layer 84 extending from electrode member 88, away from electrode member 86 across wall 94 (including element 35B), terminating in superimposition with electrode member 90, defining phase change element 48.

A dielectric fill layer (not shown) overlies thin film bridges 98 and 100. The dielectric fill layer (not shown) comprises one or more layers of silicon dioxide, a polyimide, silicon nitride or other protective and dielectric fill materials. In embodiments, the fill layer provides thermal and electrical isolation for thin film bridge 98 and thin film bridge 100. A tungsten plug 102 is in electrical communication with electrode member 88. A patterned conductive layer 104, comprising metal or other conductive material, including bit lines in an array structure, overlies the dielectric fill layer (not shown). Patterned conductive layer 104 is in electrical communication with plug 102 to facilitate access to the memory cells associated with thin film bridges 98 and 100. Specifically, the drain of access transistor 38 is in electrical communication with electrode member 86, which is in turn in electrical communication with electrode member 88 through thin film bridge 98. Likewise, the drain of access transistor 40 is in electrical communication with electrode member 90, which is in turn in electrical communication with electrode member 88 through thin film bridge 100. Electrode member 88 is in electrical communication with bit line 60. For schematic purposes, electrode member 88 is illustrated at separate locations on bit line 60. It will be appreciated that separate electrode members can be utilized for the separate memory cell bridges in other embodiments. The thin film bridge memory elements in the illustrated embodiment may be replaced in the example circuit by a variety of other memory element structures, including but not limited to pillar shaped memory elements between electrode members, conventional bottom electrode heater type elements comprising small electrodes coupled to a larger chunk of phase change material, and so called "pore" type cells in which the contact area between an electrode and the phase change material is formed within a small pore in an intervening layer.

In operation, each of phase change elements 46, 48, 50 and 52 have a data state associated therewith. The data state may be determined by comparison of the bit line voltage of a bit line for a selected memory cell coupled to a sensing node with a suitable reference voltage. The reference voltage can be established so a predetermined range of bit line voltage levels correspond to a logical "00" value, a differing range of bit line voltage levels correspond to a logical "01" value, a differing range of bit line voltage levels correspond to a logical "10" value and a differing range of bit line voltage levels correspond to a logical "11" value to provide four states corresponding to two bits of information. In a different embodiment, any number of states greater than two can be used to store more than one bit of information in the memory cell. Logical values of each memory cell are established as a function of the physical characteristics of the phase change element. As mentioned above, the resistance of each phase change element 46, 48, 50 and 52 may be changed by controlling the relative amount of amorphous and crystalline phases of the material in the volume of the phase change element. Specifically the volume of material from which phase change elements 46, 48, 50 and 52 are formed may be modulated to be in a highly amorphous phase, a highly crystalline phase or one of several intermediate forms comprising mixtures of the amorphous and crystalline phases. The term crystalline phase is used to characterize a relatively ordered structure and lower electrical resistance compared to the amorphous state. In the highly amorphous phase a voltage drop occurs across phase change elements 46, 48, 50 and 52 which may correspond to a predetermined data state, e.g., logical "11" or logical "00". In the highly crystalline phase, the voltage drop across phase change elements 46, 48, 50 and 52 is lower than in the amorphous phase and this may correspond to a data state that differs from the data state associated with the highly amorphous state. Often it is desired to have intermediate data states associated with phase change elements 46, 48, 50 and 52. This is achieved by providing phase change elements with differing ratios of crystalline to amorphous phases. As a result, each of the intermediate phases, as well as the highly amorphous and highly crystalline phases, have differing ratios of crystalline and amorphous material associated therewith and, therefore, differing ranges of resistances corresponding to the differing data states. To that end thin film bridges 98 and 100 are typically formed from chalcogenides or chalcogenide alloys.

Chalcogenides comprise compounds of a chalcogen with a more electropositive element or radical, with the understanding that chalcogens include any of the four elements oxygen (O), sulfur (S), selenium (Se), and tellurium (Te), forming part of group VI of the periodic table. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations having one or more of antimony (Sb), gallium (Ga), indium (In), and silver (Ag). Many phase change based memory materials have been described in technical literature, including alloys of: Ga/Sb, Ge/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", *SPIE* v. 3109, pp. 28-37 (1997).) More generally, a transition metal such as clromium (Cr), iron (Fe), nickel (Ni), niobium Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

An exemplary method for forming chalcogenide material uses PVD-sputtering or magnetron-sputtering method with source gas(es) of Ar, $N_2$, and/or He, etc. at the pressure of 1 mTorr~100 mTorr.

Phase change alloys can be changed from one resistance state to another by application of electrical pulses. It has been observed that a shorter, higher amplitude pulse tends to change the phase change material to a generally amorphous phase. A longer, lower amplitude pulse tends to change the phase change material to a generally crystalline phase. The energy in a shorter, higher amplitude pulse is high enough to allow for bonds of the crystalline structure to be broken and short enough to prevent the atoms from realigning into a crystalline phase. Appropriate profiles for pulses can be determined, without undue experimentation, specifically adapted to a particular phase change alloy.

Reading or writing to a memory cell of array 12, therefore, is achieved by applying a suitable selection voltage to one of word lines 56 or 58 and coupling one of bit lines 60 and 62 to a current source. The level and duration of current applied to one of the coupled bit lines 60 and 62 is dependent upon the operation performed, e.g., a reading operation or a writing operation, for example, assuming a logical "1" was the data state for one of phase change elements 46, 48, 50 and 52. To change the data state associated with phase change element 46 to a logical "1" would require crystallizing a desired portion of the volume of thin film bridge 98. Word line decoder 14 would facilitate providing word line 56 with a suitable voltage level to activate access transistor 38. Bit line decoder 18 would facilitate supplying a current pulse to bit line 60 of suitable amplitude and duration to raise the temperature of the active region in thin film bridge 98 between the glass transition temperature and the melting temperature of the material from which the same is fabricated sufficiently to crystallize a desired portion of the volume of thin film bridge 98. This would associate phase change element 46 with a logical "0"

data state. To that end, bit line decoder 18 facilitates supplying a current of suitable magnitude and duration to raise the temperature the active region of thin film bridge 98 above the melting temperature of the material from which the same is fabricated, while facilitating rapidly cooling the same so as to attenuate re-crystallization of thin film bridge 98 while the same reaches a temperature below the glass transition temperature. The intermediate data states are achieved by varying the amplitude and/or duration of the writing pulse to obtain a desired ratio of crystallization to amorphousness in each of phase change elements 46, 48, 50 and 52.

Figure 4:
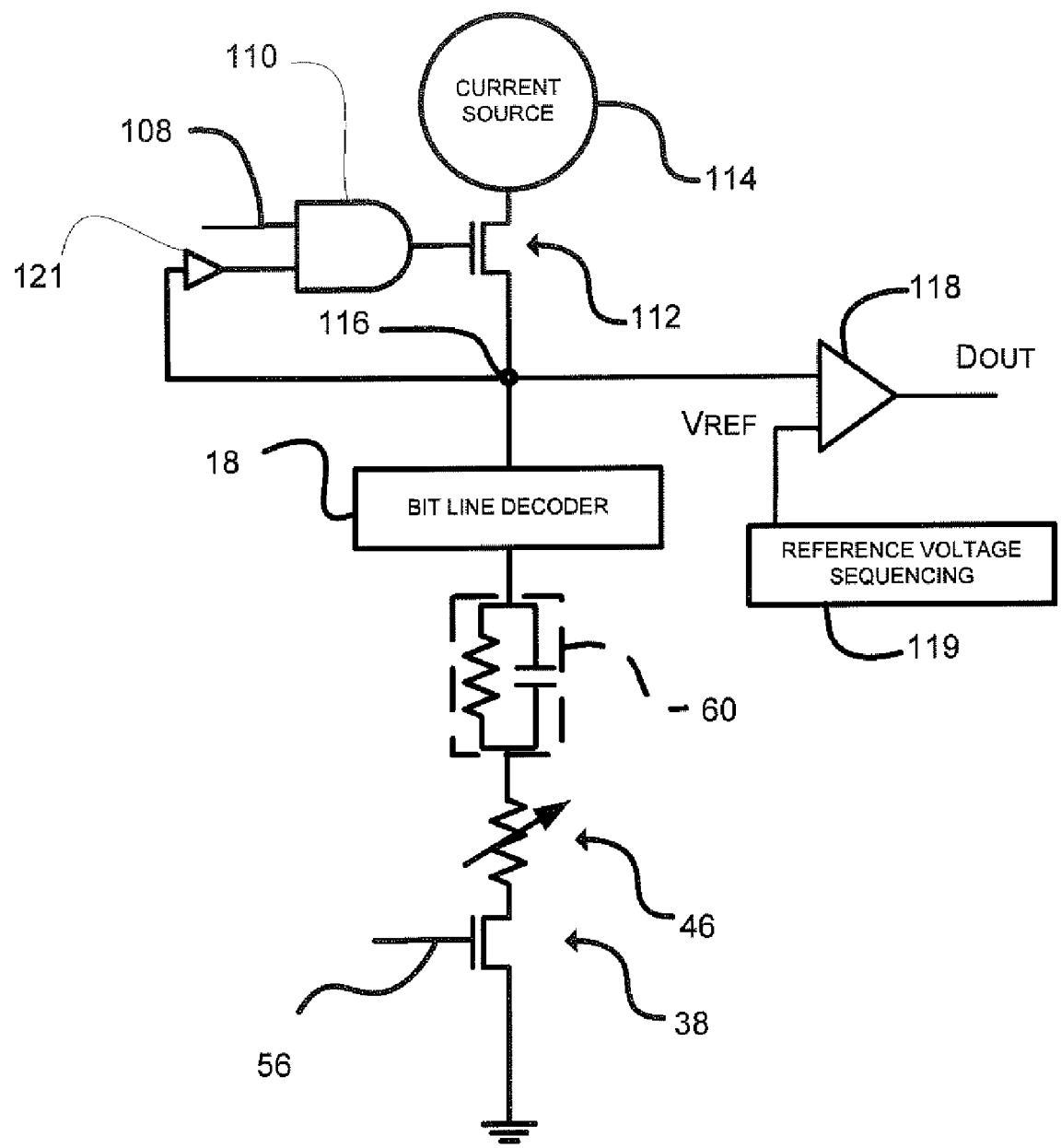
FIG. 4 is an electronic schematic of a sensing architecture in accordance with one embodiment of the present invention.
Figure 5:
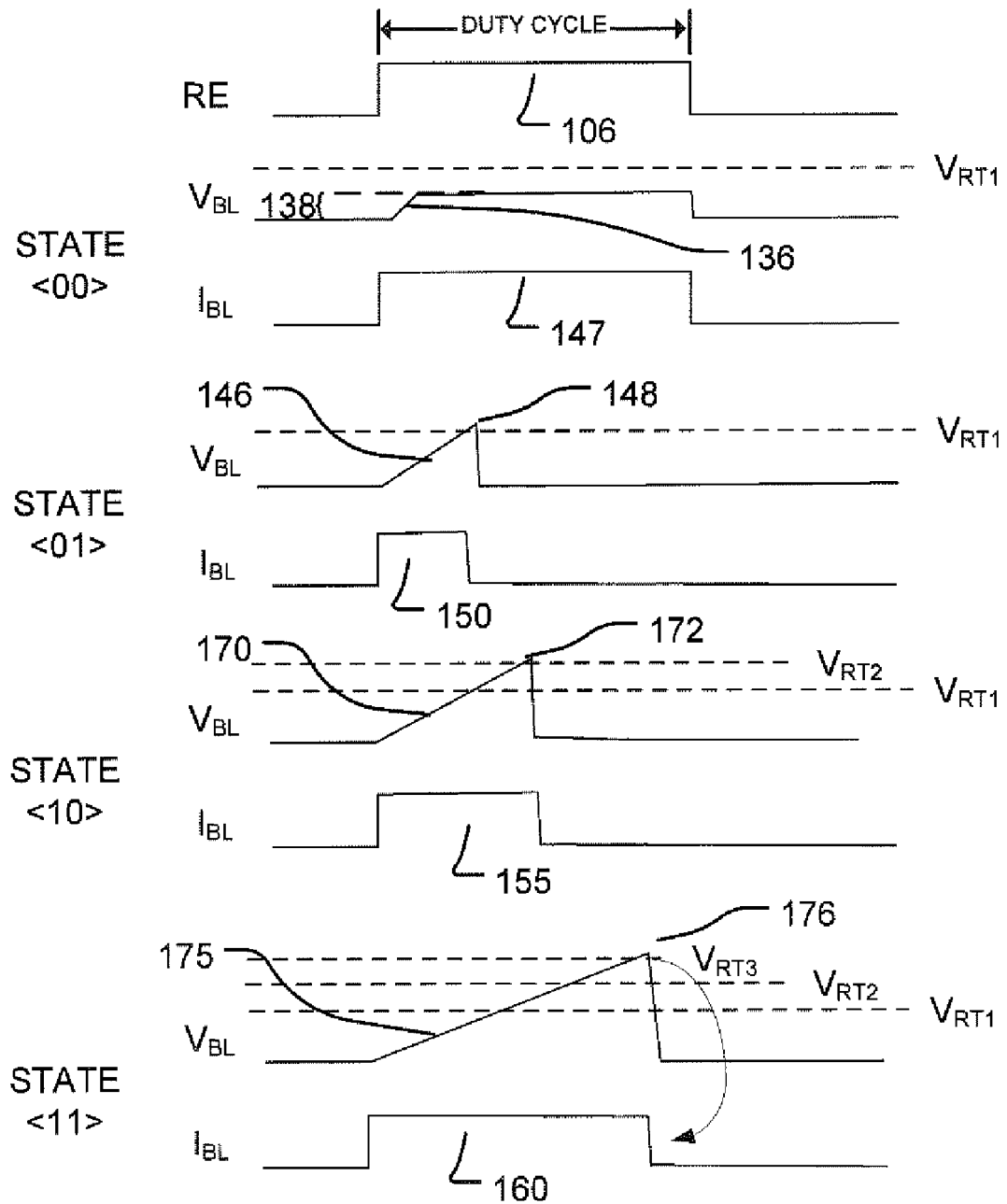
FIG. 5 is a timing diagram showing the relative timing of a read enable signal, a bit line voltage signal and a bit line read current for four different data states of a phase change element for embodiments of a sensing architecture as shown in FIG. 4.

FIG. 4 is a simplified diagram of a sensing architecture for controlling the total energy applied during a read cycle, in a multi-bit cell. In the simplified diagram, an access device and a phase change element for a memory cell are modeled by transistor 38, coupled to word line 56 and variable resistor 46 (representing the phase change memory element), respectively. Bit line circuitry is modeled by the resistor/capacitor network 60. A bit line decoder 18 is operable in response to address signals to couple a selected bit line to a sensing node 116. The sensing node 116 is coupled via switch transistor 112 to a current source 114. The sensing node 116 is also coupled to the input of a sense amplifier 118, which is operable to compare the voltage on the sensing node with a reference voltage VREF applied by reference voltage circuitry not shown, and to generate a data output signal $D_{OUT}$. The switch transistor 112 is controlled by logic circuitry 110 (modeled by an AND gate in the figure) which has a first input 108 coupled to a read enable signal, and a second input active low which is coupled to the output of a detector 121. The input of the detector 121 is coupled to the sensing node 116. The detector 121 develops a logic high output when the sensing node 116 crosses its trigger voltage. Thus, a pulse of current from the current source 114 is applied at a sensing node 116, and supplied from the sensing node 116 through decoder 18 and bit line circuitry 60 to a selected memory cell 46. The pulse of current has a magnitude controlled by the current source 114, and is substantially constant in embodiments of the technology described herein. The pulse of current has a pulse width that is controlled by the logic circuitry 110, in response to the read enable signal on input 108, which is an output of the detector 121. A timing diagram for operation of the sensing architecture of FIG. 4 is shown in FIG. 5. Thus, referring to FIGS. 4 and 5, during a read operation a read current pulse $I_{BL}$ is applied to the selected bit line and includes suitable amplitude and time duration to enable sense amplifier 118 to sense a voltage on the selected bit line. The voltage level present on the selected bit line is dependent upon the resistance of, and therefore data state associated with, the phase change element of the selected memory cell. For example, reading a data state associated with the phase change element modeled by resistor 46 is achieved by applying a control signal, such as read enable signal 106, to an input 108 of logic circuitry 110, as well as applying a word line address signal to word line decoder 14 to drive a selected word line 56 and a bit line address signal to bit line decoder 18 to couple a selected bit line 60 to the sensing node 116. Control signal 108 results in activation of a switch transistor 112 electrically coupling a current source 114 to the sensing node 116. An input of a sense amplifier 118 is coupled to detect a voltage at sensing node 116 and to compare the same with a reference voltage $V_{REF}$ to provide a requisite output at $D_{OUT}$ corresponding to a data state of phase change element 46. For a multi-bit cell, the reference voltage $V_{REF}$ is supplied by reference voltage sequencing circuits 119, so that it is changed in a sequence from a first value $V_{REF1}$, used for distinguishing between the lowest resistance phase and a first intermediate phase, a second value $V_{REF2}$ used for distinguishing between the first intermediate phase and a second intermediate phase, and a third value $V_{REF3}$ used for distinction between the second intermediate phase and a highest resistance phase. Such sequencing circuits 119 may be implemented using voltage dividers and switches under control of a read state machine, or using other technologies. Detector 121 has a normally low output in the illustrated embodiment, which rises to a high level when the sensing node 116 reaches a trigger voltage. When the detector 121 produces a high output, the switch transistor 112 is turned off, disconnecting the current source 114 from the sensing node 116, and ending the read cycle. In one embodiment, the detector 121 operates with a trigger level which is switched to match the reference voltage being applied during the read cycle as shown in FIG. 5. In one example, three detectors are coupled in parallel with respective trigger levels, and enabled in the same sequence as the reference voltage is applied. In embodiments of the technology, the detector operates with a single trigger level corresponding to $V_{REF3}$. This can be used to ensure that the voltage drop over the phase change element present during reading never exceeds the threshold voltage of the phase change material in the amorphous state.

A problem overcome by the present invention concerns data state consistency of phase change elements 46, 48, 50 and 52 in the presence of the read current. The resistance of phase change elements 46, 48, 50 and 52 in the intermediate state may change in the presence of a read current. Read current may generate enough heat in each read cycle in the phase change element to cause a portion of the amorphous region of the phase change element to crystallize, thereby reducing the resistance of the phase change element. This requires use of a large range of voltages for each data state, reducing the sensing margin, and in some cases causing the cell to change to another, unintended, data state. The heat generated at the phase change element is attributed to the total energy to which the phase change element is subjected. The energy is the integral over time of the power applied to the phase change element. Therefore, it is determined by the resistance of the phase change element, the magnitude of the read current, and the pulse width of the read current. The power applied is determined by the following well known relationship:

$P = I^2 R$; and where P is power in Watts, I is current in Amperes, and R is resistance in Ohms. As can be seen the power, P, to which phase change elements 46, 48, 50 and 52 are subjected increases quadratically with current. Assuming a constant magnitude of current, the time during which the phase change elements 46, 48, 50 and 52 are subjected to the constant current and the resistance of the elements determines the amount of energy to which the phase change elements 46, 48, 50 and 52 are subjected. To control the energy to which the phase change elements 46, 48, 50 and 52 are exposed during a read cycle, the time and the magnitude of the current are controlled in the sensing architecture described herein.

Figure 6:
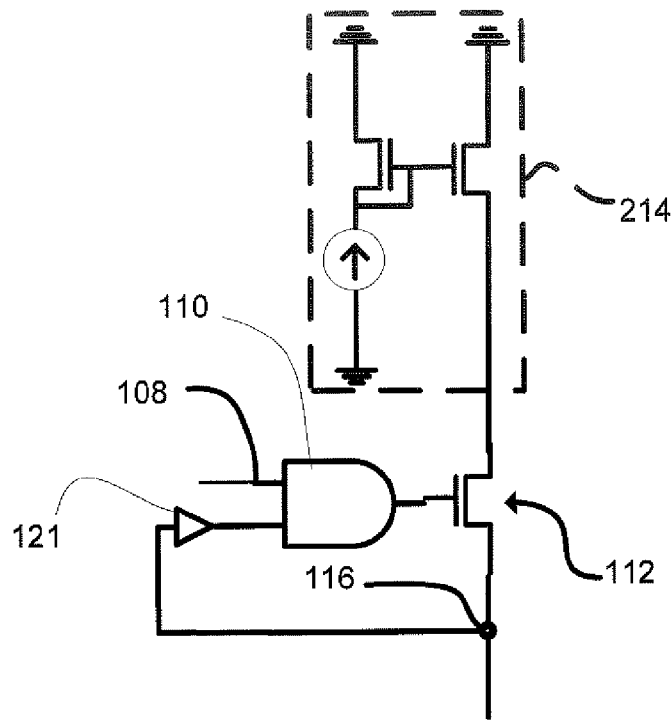
FIG. 6 is an electronic schematic of a sensing architecture in accordance with a first alternate embodiment.
Figure 7:
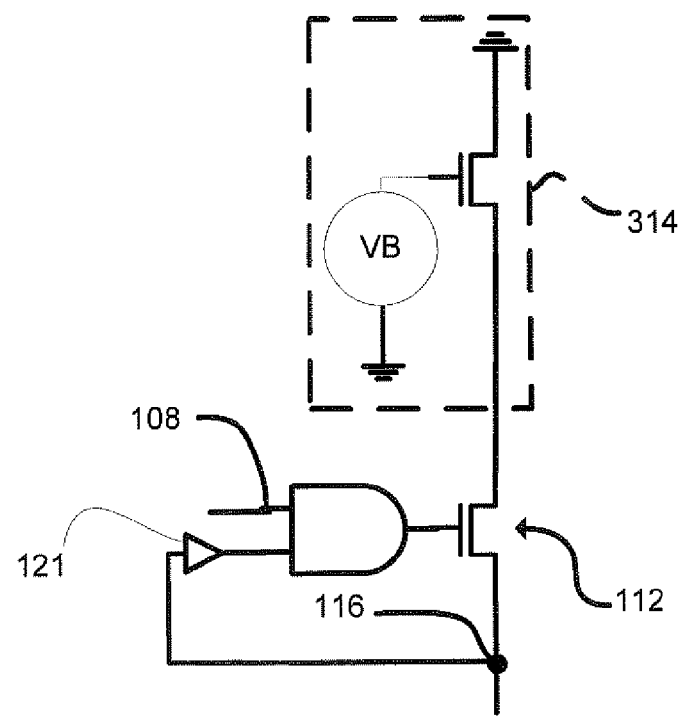
FIG. 7 is an electronic schematic of a sensing architecture in accordance with a second alternate embodiment of the present invention.

To that end, current source 114 is configured as a constant current source in the illustrated embodiment. The constant current source provides, to the selected bit line, for example, 1 microampere of current with no more than ±5% fluctuation. Alternatively, the current source may provide 5 microamperes of current with a no more than ±5% fluctuation. Additionally, the current source may provide 10 microamperes of current with no more than ±5% fluctuation. To that end, current source 114, shown in FIG. 4, may comprise a current mirror 214, shown in FIG. 6, or a field-effect transistor 314, shown in FIG. 7, biased to operate at a constant current source. It should be noted that any other constant current source may be provided, including circuits comprising JFETs and bipolar transistor circuits, as known in the art. The magnitude of the constant current source is selected depending on characteristics of the memory cell, characteristics of the array of memory cells, speed requirements for operation of the device, and other design parameters. Thus, in this embodiment, the pulse of read current in response to the read enable signal RE, has a substantially constant magnitude 147, and terminates in response to the output of the detector 121.

For example, during the duty cycle DC shown in FIG. 5 of the read enable signal 106, the bit line voltage signal 136 of bit line 60 at sensing node 116 rises, shown by leading edge 136 to an amplitude, referred to herein as a stabilization voltage 138. The rise time of leading edge of voltage signal 136 is attributable to magnitude of the current pulse in the read cycle, the physical parameters of the bit line 60 and the resistance of the phase change element. The stabilization voltage 138 on bit line 60 is shown as being below the reference voltage $V_{REF1}$, and thus below read termination voltage $V_{RT1}$ which controls the detector 121 for the entire duty cycle DC of the read enable control signal 106. The amplitude of the stabilization voltage 138 remains below read termination voltage $V_{RT1}$, because phase change element 46 is in the lower resistance, highly crystalline state, resulting in a smaller voltage drop. As a result, the read current pulse 147 of the read signal maintains a constant level for the duration of the duty cycle of read control signal 106.

The timing for sensing a first intermediate state is shown with reference to the graph of bit line voltage signal 146. This corresponds to phase change element 46 in an intermediate state with a higher resistance than a cell in a highly crystalline phase, but a relatively lower resistance than another immediate state. As illustrated in FIG. 5, bit line voltage signal 146 is shown having a peak voltage 148 that is greater than read termination voltage $V_{RT1}$. Upon reaching the first read termination voltage, the read current pulse 150 is terminated so that the amount of energy delivered to the memory cell is limited during sensing of the intermediate state.

The timing for sensing a second intermediate state is shown with reference to the graph of bit line voltage 170. The bit line voltage 170 in shown ramping during the read current pulse to a peak voltage 172 above a second read termination voltage $V_{RT2}$, higher than the first read termination voltage. The second read termination voltage $V_{RT2}$ is selected to ensure that the sensing node 116 exceeds the second reference voltage $V_{REF2}$ to enable accurate sensing of the data on the bit line. As can be seen, the ramp of bit line voltage 170 to reach the read termination voltage $V_{RT2}$ causes the read current pulse 155 to terminate before the end of the duty cycle of the read enable signal, limiting the amount of energy delivered to the memory cell during sensing of the second intermediate state.

The timing for sensing a high impedance state is shown with reference to the graph of bit line voltage 175. The bit line voltage 175 is shown ramping during the read current pulse 176 to reach a third read termination voltage $V_{RT3}$. The third read termination voltage $V_{RT3}$ is selected to ensure that the sensing node 116 exceeds the third reference voltage $V_{REF3}$ to enable accurate sensing of the data on the bit line. After reaching the third read termination voltage, read current pulse 160 is terminated ending the read cycle.

In an alternate embodiment, the detector 121 is configured to detect only the third read termination voltage $V_{RT3}$. In this alternate embodiment, the pulse width of the read current is still controlled in a similar manner. The sensing of the state of the memory cell can be based on the timing, where the read termination voltage $V_{RT3}$ will be reached faster for higher resistance states.

Figure 8:
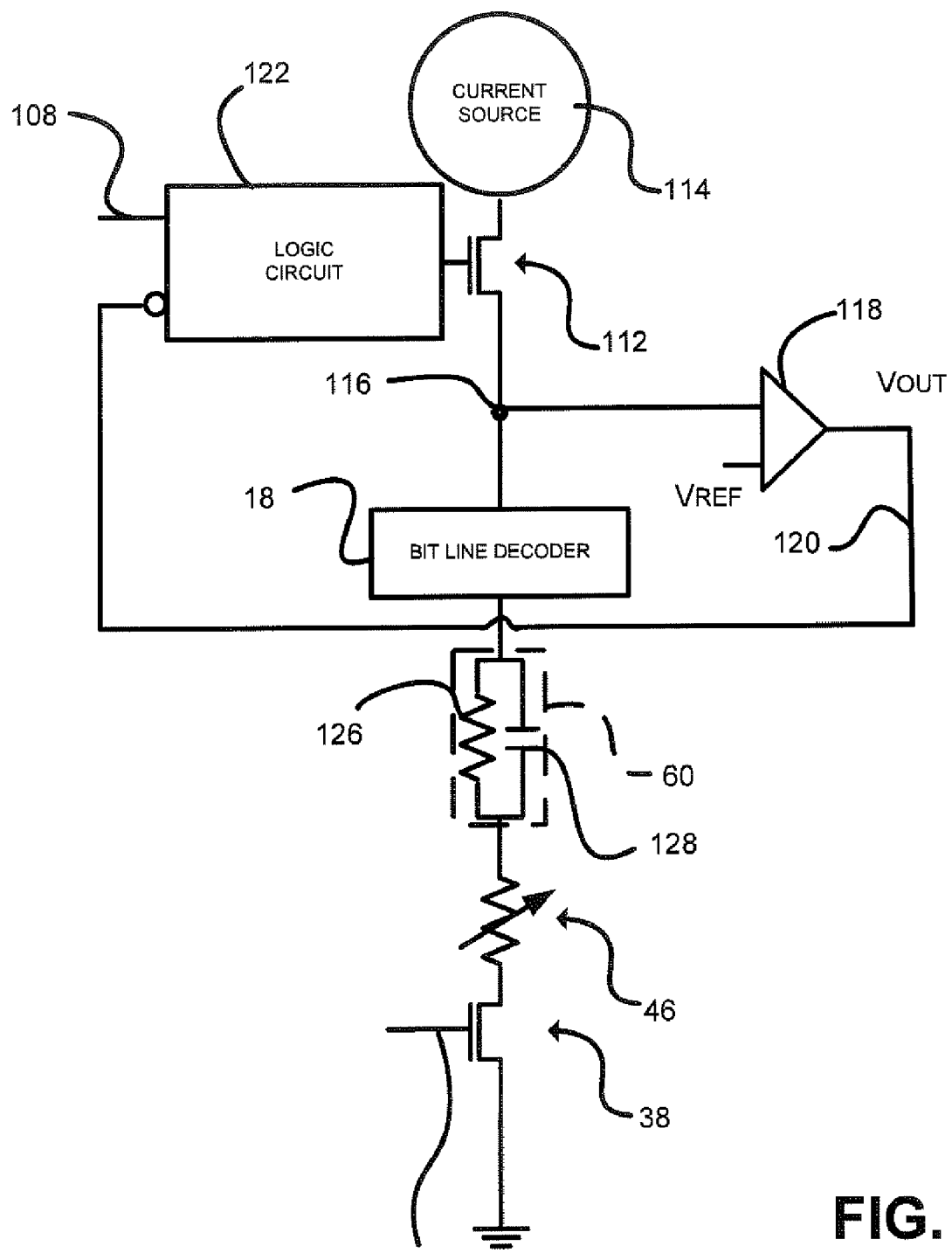
FIG. 8 is an electronic schematic of a sensing architecture in accordance with a third alternate embodiment of the present invention.

FIG. 8 shows an alternate embodiment of the sensing architecture in which the output of the sense amplifier 118 is applied in feedback on line 120 to logic circuit 122 used for controlling the switch transistor 112. In the embodiment of FIG. 8, the function of the detector 121 illustrated in FIG. 4 is provided by the sense amplifier 118. Otherwise, the implementations are similar. Thus, referring to FIGS. 5 and 8, to regulate the time to which the phase change element is subjected to the read current, a feedback line 120 is employed by which $D_{OUT}$ from sense amplifier 118 is coupled to a logic circuit 122. Feedback line 120 operates to transmit a read termination signal to logic circuit 122. The read termination signal terminates the control voltage to switch transistor 112. In response, logic circuit 122 causes termination of the pulse of read current on the selected bit line.

Figure 9:
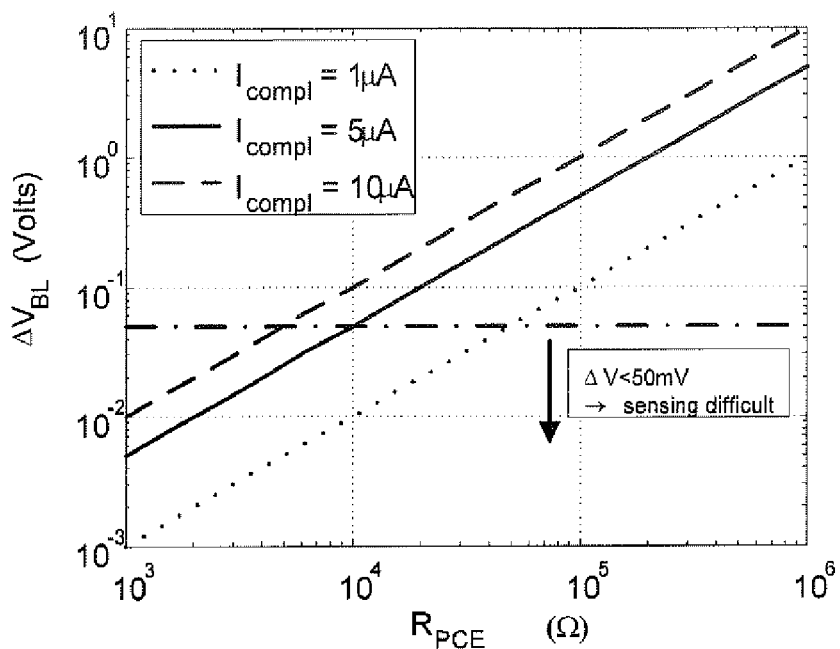
FIG. 9 is a graph showing a relationship between a change in voltage drop across a phase change element and the change in resistance of the same for differing read currents.
Figure 10:
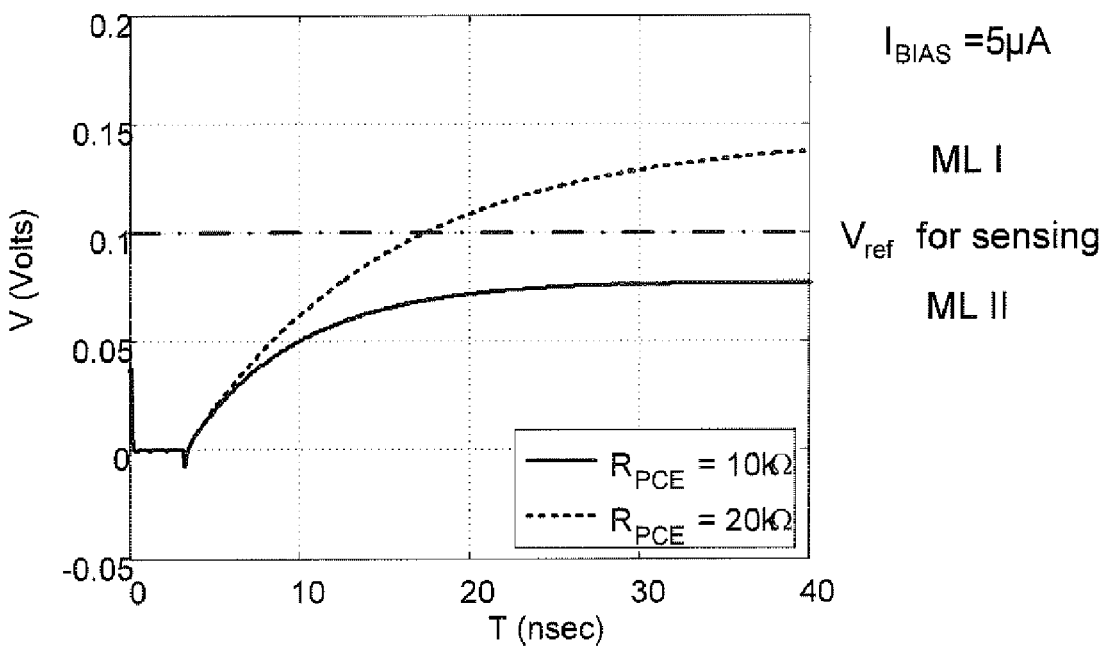
FIG. 10 is a graph showing a relationship between time and a change in voltage drop across a phase change element for phase change elements of differing resistance.

It should be understood that in order to accurately sense the data state of one of phase change elements 46, 48, 50 and 52, and to meet sensing speed limitations in a design, there exists a minimum duty cycle for the read current. For example, in a representative example it is desired that that voltage level sensed at sensing node 116 differ by at least 50 millivolts for any two data states. The magnitude of resistance change required in the phase change element to provide the 50 millivolt difference is a function of the read current. With reference to the chart in FIG. 9, for a read current of approximately 1 microampere, the voltage drop across a phase change element of approximately 50 millivolts indicates that the phase change element has undergone a change in resistance of approximately 50,000 Ohms. As would be expected, however, a read current of greater magnitudes for example 5 microamperes and 10 microamperes as shown by the chart in FIG. 9, would necessitate less of a change in resistance for a change of 50 millivolts voltage drop across the phase change element, However, before detecting a low resistance state, sufficient time must be provided to ensure that the sensing node 116 has reached a stabilization voltage, i.e. a voltage the magnitude of which is substantially stable. This is dependent, in part, on the read current, as well as the resistance of the phase change element and, therefore, the data state of the phase change element. As shown by the curve in FIG. 10, it is seen that for a 5 microampere read current the time for voltage stabilization to occur for a phase change element of approximately 10,000 Ohms is 20 nanoseconds. The time for voltage stabilization for a phase change element of approximately 20,000 Ohms is nearly 40 nanoseconds. Thus, the read cycle time, determined by the read enable signal in the embodiments described above, must be long enough to allow for sensing of the lowest resistance cell.

Figure 11:
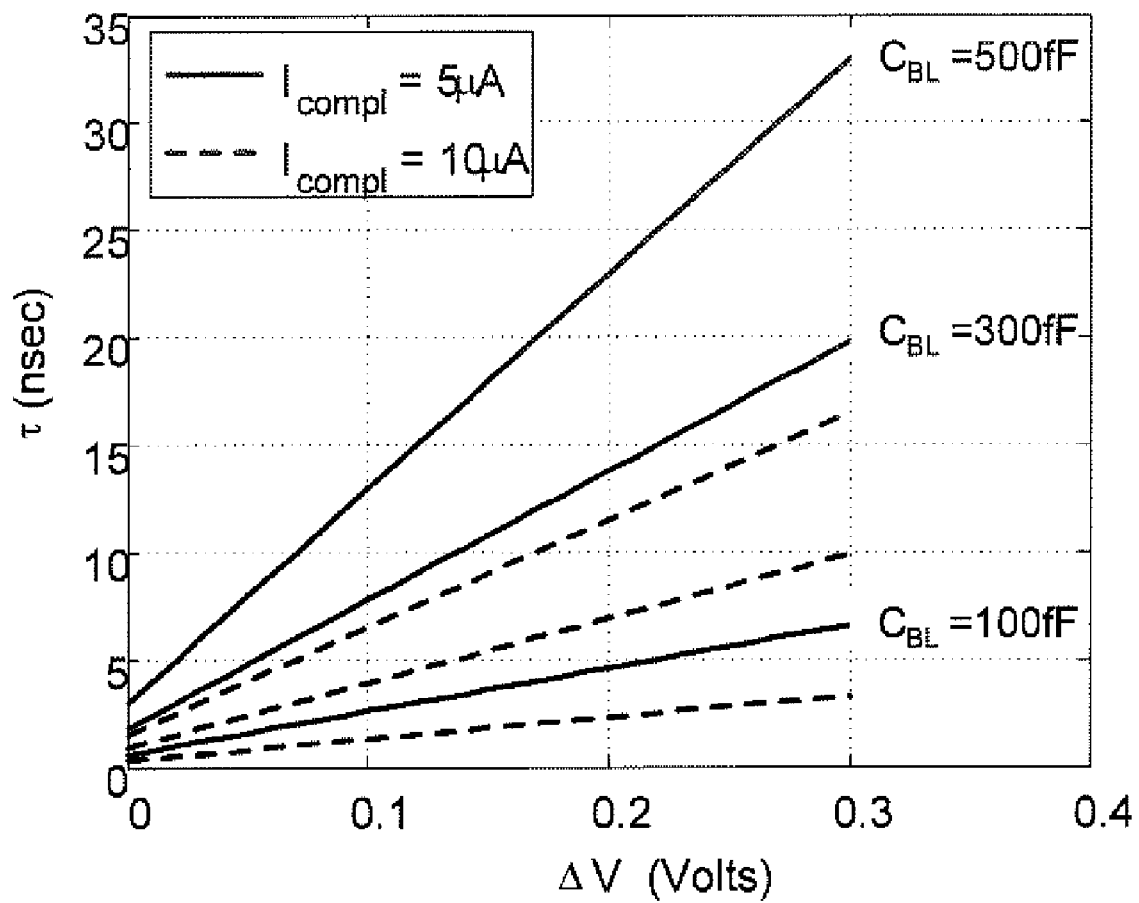
FIG. 11 is a graph showing a relationship between time and a change in voltage for bit lines of differing capacitance.

Referring to FIG. 4, bit line 60 may be modeled as an RC circuit having capacitance and resistance shown by resistor 126 and capacitor 128. FIG. 11 shows a graph in which the slope of lines 230, 232 and 234 corresponds to read current of approximately 5 microamperes and demonstrates that a bit line having a capacitance of 500 femtofarads requires at least 10 nanoseconds longer to reach a stabilization voltage than a bit line having a capacitance of 300 femtofarads and at least five times longer than a bit line having a capacitance of 100 femtofarads. Lines 236, 238 and 240 correspond to a read current of approximately 10 microamperes. It can be seen, as expected, that the voltage stabilization time decreases as the read current increases. For example, comparing line 234 with line 240 it is demonstrated that a bit line having a capacitance of 500 femtofarads reaches a stabilization voltage in less than half the time for a 10 microampere read current compared with a 5 microampere read current. This is also true for bit lines having lesser capacitance as seen by comparing the slope of lines 232 with 238 and the slope of lines 230 with 236.

Figure 12:
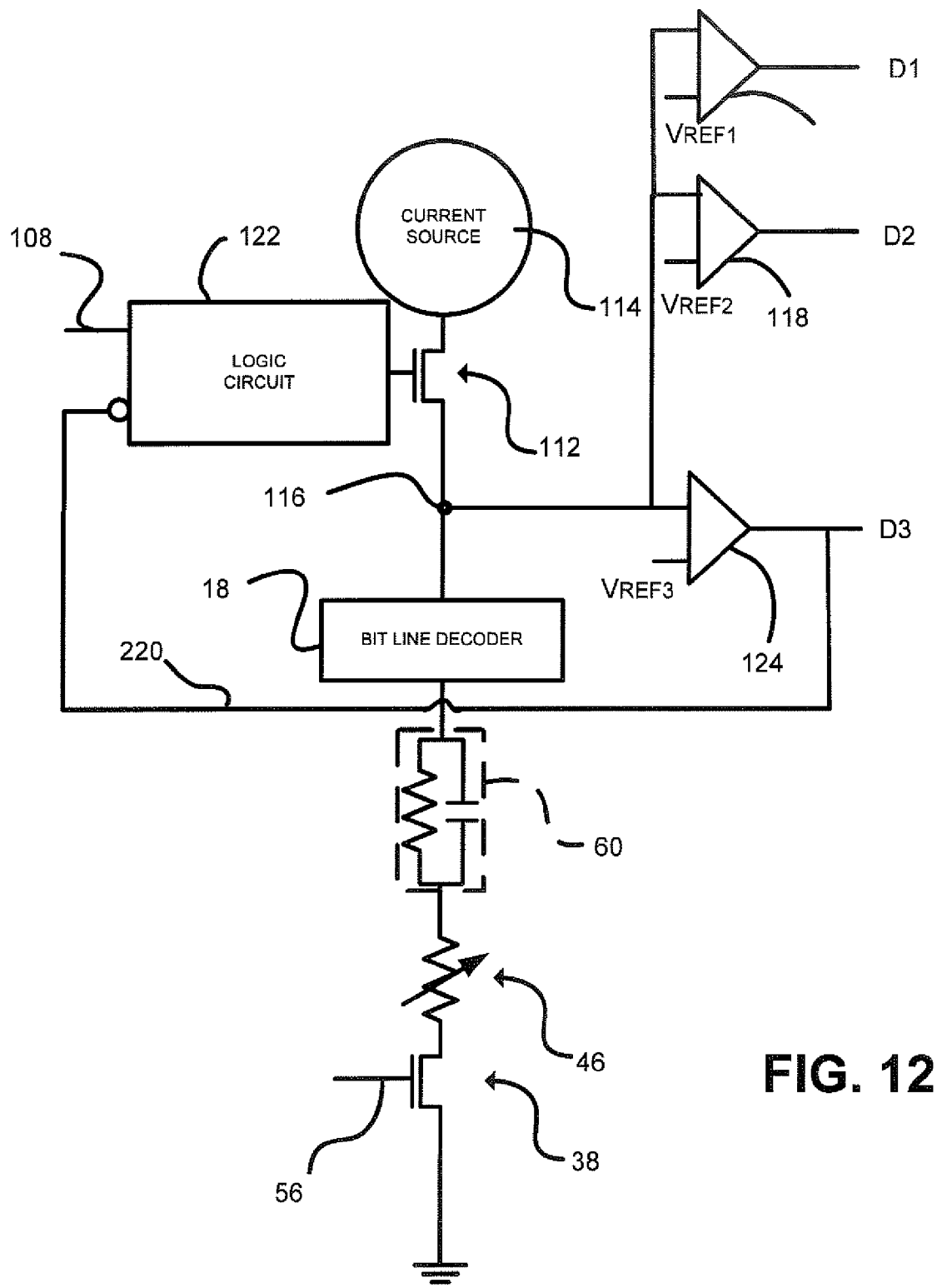
FIG. 12 is an electronic schematic of a memory cell as shown in FIG. 2 in accordance with a fourth alternate embodiment of the present invention.

FIG. 12 shows yet another embodiment of a sensing architecture for controlling the amount of total energy applied to the phase change cell during a read cycle. In the embodiment illustrated in FIG. 12, components that are common with the embodiment of FIG. 4 are given like reference numerals. Thus, a memory cell and bit line are modeled by the components 38, 46 and 60. A bit line decoder 18 is operable to couple a selected bit line 62 to a sensing node 116. Current source 114 delivers a read pulse through switch transistor 112 to the sensing node 116. Logic circuit 122 is responsive to a read enable signal on input 108 and to a read termination signal on line 220, to apply a control signal to the gate of the switch transistor 112. In the embodiment illustrated in FIG. 12, a plurality of sense amplifiers 221, 222, 223 are operated in parallel, with respective reference voltages $V_{REF1}$, $V_{REF2}$, and $V_{REF3}$ for high-speed sensing. Outputs D1, D2 and D3 are applied in parallel to logic (not shown) which decodes the multiple data states in a sensed memory cell. The function of the detector 121 of FIG. 4 is provided by feeding back the output of the sense amplifier 223 on line 220 to logic circuit 122. Thus, the read termination voltage for all data states corresponds with $V_{REF3}$ in the embodiment illustrated in FIG. 12.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A memory device, comprising:
 a memory cell coupled to a bit line and a word line and including phase change material having a data state associated therewith;
 a sense amplifier defining a sensing node;
 circuitry to selectively place the bit line in signal communication with the sensing node, defining a selected bit line;
 a current source to produce a read current;
 a switch coupled to selectively apply the read current to the sensing node; and
 circuitry coupled to the switch and responsive to a signal from the selected bit line to control a quantity of energy to which the phase change material in the memory cell associated with the selected bit line is subjected to in the presence of the read current so that the data state remains consistent, wherein the sense amplifier includes a reference input, and circuitry to supply a reference voltage having a plurality of values to the reference input, and the sense amplifier is adapted to sense a voltage on the sensing node relative to said plurality of values in a sensing sequence to detect multiple bits of data from a selected memory cell.

2. The memory device of claim 1, wherein the circuitry includes a detector coupled to the sensing node, to detect a voltage on the sensing node, and the logic to cause the switch to terminate electrical communication of the current source with the sensing node.

3. The memory device of claim 1, wherein the circuitry includes logic responsive to a read enable signal indicating a start of a read cycle to control the switch to selectively place the current source in electrical communication with the sensing node, with the logic being responsive to an output from the sense amplifier to cause the switch to terminate electrical communication of the current source with the sensing node.

4. The memory device of claim 1, wherein the circuitry includes a detector coupled to the sensing node, to detect a voltage on the sensing node, and logic responsive to a read enable signal indicating a start of a read cycle to control the switch to selectively place the current source in electrical communication with the sensing node, with the logic being responsive to an output from the detector to cause the switch to terminate electrical communication of the current source with the sensing node.

5. The memory device of claim 1, wherein the current source comprises a current mirror.

6. The memory device of claim 1, wherein the current source includes a field effect transistor biased to operate as a constant current device.

7. The memory device of claim 1, wherein the memory cell is characterized by having a relatively high resistance data state, at least one relatively intermediate resistance data state, and a relatively low resistance data state, and wherein the circuitry controls the switch to terminate electrical communication of the current source with the sensing node, in response to detection of a voltage on the sensing node that is high enough to ensure proper sensing of the relatively high resistance data state.

8. The memory device of claim 1, wherein the memory cell is characterized by having a relatively high resistance data state, at least one relatively intermediate resistance data state, and a relatively low resistance data state, and wherein the circuitry controls the switch to terminate electrical communication of the current source with the sensing node, in response to detection of a voltage on the sensing node that is high enough to ensure proper sensing of the data state of the memory cell.

9. A memory device, comprising:
 a memory cell coupled to a bit line and a word line and including phase change material having a data state associated therewith;
 a plurality of sense amplifiers coupled in parallel to a sensing node, said plurality of sense amplifiers including respective reference inputs, and including circuitry to supply reference voltages to the respective reference inputs having a plurality of values, and so that the plurality of the sense amplifiers detect multiple bits of data from a selected memory cell;
 circuitry to selectively place the bit line in signal communication with the sensing node, defining a selected bit line;
 a current source to produce a read current;
 a switch coupled to selectively apply the read current to the sensing node; and
 circuitry coupled to the switch and responsive to a signal from the selected bit line to control a quantity of energy to which the phase change material in the memory cell associated with the selected bit line is subjected to in the presence of the read current so that the data state remains consistent.

10. A memory device, comprising:
 a memory cell coupled to a bit line and a word line and including phase change material having a data state associated therewith;
 a sense amplifier defining a sensing node;
 circuitry to selectively place the bit line in signal communication with the sensing node, defining a selected bit line;

a current source to produce a read current;

a switch coupled to selectively apply the read current to the sensing node; and circuitry coupled to the switch and responsive to a signal from the selected bit line to control a quantity of energy to which the phase change material in the memory cell associated with the selected bit line is subjected to in the presence of the read current so that the data state remains consistent, wherein the circuitry includes a detector coupled to the sensing node, to detect a voltage on the sensing node, and the logic to cause the switch to terminate electrical communication of the current source with the sensing node.

11. A method of reading a memory cell including phase change material having a data state associated therewith, said method comprising:

applying a read current to said memory cell to read said data state;

sensing a voltage on a sensing node relative to a plurality of reference voltages in a sensing sequence to detect multiple bits of data from a selected memory cell; and controlling the total energy to which the phase change material is subjected in the presence of said read current so that data associated with the phase change material remains consistent.

12. The method of claim 11, wherein controlling further includes regulating a magnitude of said read current to be within predetermined levels for a predetermined duration of time.

13. The method of claim 11, wherein controlling further includes regulating the read current to prevent crystallizing a volume of the phase change material to an extent that defines a change in data states associated therewith.

14. The method of claim 11, wherein controlling further includes regulating a magnitude and pulse width of the read current to prevent crystallizing a volume of the phase change material to an extent that defines a change in data states associated therewith.

15. The method of claim 11, and wherein said applying includes connecting a current source to the sensing node, and said controlling includes detecting a voltage on the sensing node, and in response to the detecting, disconnecting the current source from the sensing node.

16. The method of claim 11, including controlling the magnitude of the read current, so that the read current remains substantially constant during reading of the memory cell.

17. The method of claim 11, wherein the memory cell is characterized by having a relatively high resistance data state, at least one relatively intermediate resistance data state, and a relatively low resistance data state, and wherein said applying includes connecting a current source to the sensing node, and said controlling includes detecting a voltage on the sensing node, and in response to the detecting, disconnecting the current source from the sensing node, wherein said detected voltage on the sensing node is high enough to ensure proper sensing of the relatively high resistance data state.

18. The method of claim 11, wherein the memory cell is characterized by having a relatively high resistance data state, at least one relatively intermediate resistance data state, and a relatively low resistance data state, and wherein said applying includes connecting a current source to the sensing node, and said controlling includes detecting a voltage on the sensing node, and in response to the detecting, disconnecting the current source from the sensing node, wherein said detected voltage on the sensing node is high enough to ensure proper sensing of the data state of the memory cell.

19. A memory device, comprising:

a memory cell coupled to a bit line and a word line and including phase change material having a data state associated therewith;

a sense amplifier defining a sensing node;

circuitry to selectively place the bit line in signal communication with the sensing node, defining a selected bit line;

a current source to produce a read current;

a switch coupled to selectively apply the read current to the sensing node; and circuitry coupled to the switch and responsive to a signal from the selected bit line to control a quantity of energy to which the phase change material in the memory cell associated with the selected bit line is subjected to in the presence of the read current so that the data state remains consistent, the circuitry including logic responsive to a read enable signal indicating a start of a read cycle to control the switch to selectively place the current source in electrical communication with the sensing node, with the logic being responsive to an output from the sense amplifier to cause the switch to terminate electrical communication of the current source with the sensing node.

20. A method of reading a memory cell including phase change material having a data state associated therewith, said method comprising:

applying a read current to said memory cell to read said data state including coupling the memory cell to a sensing node and connecting a current source to the sensing node; and controlling the total energy to which the phase change material is subjected in the presence of said read current so that data associated with the phase change material remains consistent, said controlling including detecting a voltage on the sensing node, and in response to the detecting, disconnecting the current source from the sensing node.

* * * * *